(12) United States Patent
Yang

(10) Patent No.: US 12,022,623 B2
(45) Date of Patent: Jun. 25, 2024

(54) DISPLAY DEVICE AND TERMINAL APPARATUS

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventor: Liu Yang, Shanghai (CN)

(73) Assignees: Wuhan Tianma Micro-Electronics Co., Ltd., Wuhan (CN); Wuhan Tianma MicroElectronics Co., Ltd. Shanghai Branch, Shanghai (CN)

( * ) Notice: Subject to any disclaimer, the term of this patent is extended or adjusted under 35 U.S.C. 154(b) by 219 days.

(21) Appl. No.: 17/702,053

(22) Filed: Mar. 23, 2022

(65) Prior Publication Data

US 2023/0209731 A1 Jun. 29, 2023

(30) Foreign Application Priority Data

Dec. 29, 2021 (CN) .......................... 202111639807.6

(51) Int. Cl.
*H05K 5/00* (2006.01)
*H05K 5/02* (2006.01)

(52) U.S. Cl.
CPC ......... *H05K 5/0017* (2013.01); *H05K 5/0021* (2013.01); *H05K 5/0217* (2013.01)

(58) Field of Classification Search
CPC ... H05K 5/0017; H05K 5/0021; H05K 5/0217
USPC .................................................. 361/173, 807
See application file for complete search history.

(56) References Cited

U.S. PATENT DOCUMENTS

| 8,860,656 B1* | 10/2014 | Cho ..................... G06F 1/1643 345/173 |
| 11,204,631 B2* | 12/2021 | Mehandjiysky ........ G09F 9/301 |
| 2005/0134524 A1* | 6/2005 | Parker .................. G06F 3/1438 345/1.1 |
| 2007/0063923 A1* | 3/2007 | Koenig ................. G06F 1/1647 345/1.1 |
| 2009/0275366 A1* | 11/2009 | Schilling ............. H04M 1/0247 455/566 |
| 2012/0182295 A1* | 7/2012 | Schilling ............... G06F 1/1641 345/418 |
| 2013/0141857 A1* | 6/2013 | Sano ..................... G06F 1/1615 312/309 |
| 2014/0378183 A1* | 12/2014 | Xiong .................. G06F 1/1647 455/566 |

(Continued)

FOREIGN PATENT DOCUMENTS

| CN | 102387230 A | 3/2012 |
| CN | 104483825 B | 1/2017 |

(Continued)

*Primary Examiner* — Timothy J Thompson
*Assistant Examiner* — Michael F McAllister
(74) *Attorney, Agent, or Firm* — Anova Law Group, PLLC

(57) ABSTRACT

A display device and a terminal apparatus are provided. The display device includes a display screen and a first drive assembly. The display screen includes a main screen and a secondary screen. The first drive assembly is connected to at least one of the main screen and the secondary screen, and is configured to drive the main screen and/or the secondary screen to move, for changing a size and/or a shape of a display area of the display screen.

19 Claims, 15 Drawing Sheets

(56) References Cited

U.S. PATENT DOCUMENTS

| | | | | |
|---|---|---|---|---|
| 2015/0161932 A1* | 6/2015 | Kure | ................... | G09G 3/2007 |
| | | | | 345/102 |
| 2015/0169274 A1* | 6/2015 | Holung | ................ | G06F 1/1626 |
| | | | | 345/1.3 |
| 2018/0129249 A1* | 5/2018 | Ko | ........................ | G04C 10/02 |
| 2021/0120685 A1* | 4/2021 | Zhu | ..................... | H05K 5/0017 |
| 2022/0132691 A1* | 4/2022 | Zhao | .................... | G06F 1/1637 |

FOREIGN PATENT DOCUMENTS

| | | | |
|---|---|---|---|
| CN | 209690725 U | | 11/2019 |
| CN | WO 2021008404 | * | 1/2021 |
| CN | 112987549 | * | 6/2021 |
| CN | 113803579 A | | 12/2021 |

* cited by examiner

DISPLAY DEVICE AND TERMINAL APPARATUS

CROSS-REFERENCE TO RELATED APPLICATION

This application claims priority of Chinese Patent Application No. 202111639807.6, filed on Dec. 29, 2021, the entire content of which is hereby incorporated by reference.

FIELD OF THE DISCLOSURE

The present disclosure generally relates to the field of display device technology and, more particularly, relates to a display device and a terminal apparatus.

BACKGROUND

For conventional display devices such as watches and wristbands, their appearances, especially shapes of display areas, are basically unchangeable. Thus, forms of the display devices may be too single, affecting user experiences.

SUMMARY

One aspect of the present disclosure includes a display device. The display device includes a display screen and a first drive assembly. The display screen includes a main screen and a secondary screen. The first drive assembly is connected to at least one of the main screen and the secondary screen, and is configured to drive the main screen and/or the secondary screen to move, for changing a size and/or a shape of a display area of the display screen.

Another aspect of the present disclosure includes a terminal apparatus. The terminal apparatus includes display device. The display device includes a display screen and a first drive assembly. The display screen includes a main screen and a secondary screen. The first drive assembly is connected to at least one of the main screen and the secondary screen, and is configured to drive the main screen and/or the secondary screen to move, for changing a size and/or a shape of a display area of the display screen.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Technologies, methods, and equipment known to those of ordinary skill in relevant fields may not be discussed in detail, but where appropriate, these technologies, methods, and equipment should be regarded as part of the specification.

Terms such as "first" and "second" in the present disclosure are only for convenience of describing two or more structures or components with same or similar structures or functions, and do not represent any special limitations on order or importance.

Reference will now be made in detail to embodiments of the present disclosure, which are illustrated in the accompanying drawings. Wherever possible, the same reference numbers will be used throughout the drawings to refer to the same or like parts.

Figure 1:
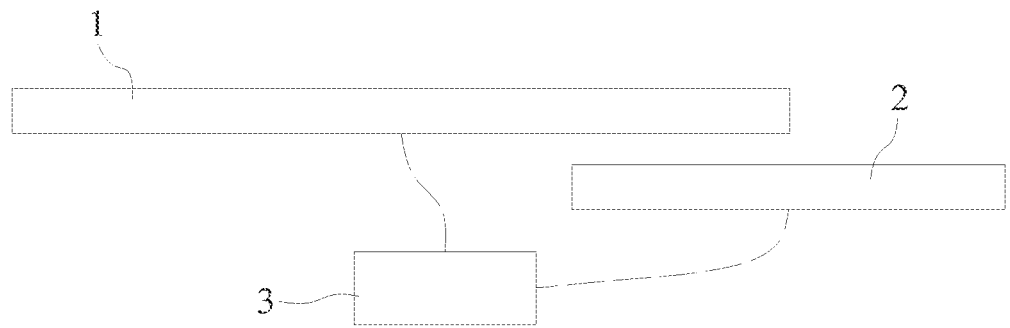
FIG. 1 illustrates a schematic structural diagram of a display device consistent with the disclosed embodiments of the present disclosure.

The present disclosure provides a display device. FIG. 1 illustrates a schematic structural diagram of a display device consistent with the disclosed embodiments of the present disclosure. With reference to FIG. 1, the display device includes a display screen and a first drive assembly 3. The display screen includes a main screen 1 and a secondary screen 2. The first drive assembly 3 is connected to at least one of the main screen 1 and the secondary screen 2, and may be used for driving the main screen 1 and/or the secondary screen 2 to move. In the present disclosure, the term "main screen 1 and/or the secondary screen 2" specifically refers to: the main screen 1, or the secondary screen 2, or the main screen 1 and the secondary screen 2.

By moving the main screen 1 and/or the secondary screen 2, the size and/or shape of the display area of the display screen may be changed. Accordingly, the display device may exhibit more forms, and a user may switch the forms of the display device according to his needs. Accordingly, usage requirements of the user may be met, and usage experience may be improved. In the present disclosure, the term "size and/or shape" specifically refers to: size, or shape, or size and shape.

Moreover, movements of the main screen 1 and/or the secondary screen 2 may be automatically completed under actions of the first drive assembly 3. A user may not need to directly apply force with fingers to movable parts in the main screen 1 and/or the secondary screen 2 to move the main screen 1 and/or the secondary screen 2. On one hand, the automation level may be improved to reduce the operation difficulty of a user, and the user experience may thus be improved. On other hand, the shifting operation of the main screen 1 and/or the secondary screen 2 by a user with fingers may be reduced, and thus the main screen 1 and the secondary screen 2 may be protected. Accordingly, damage to the display screen may be reduced, and the service life of the display device may be extended.

In one embodiment, a start switch may be configured for the first drive assembly 3. The start switch may be connected to driving signals of the first drive assembly 3 for controlling the start and stop of the first drive assembly 3. The start switch may be a physical button. In this case, there are a plurality of position options for setting the physical button. For example, the physical button may be set on the display device provided by the present disclosure, or the physical button may be set on a terminal apparatus configured with the display device provided by the present disclosure. In addition, the start switch may also be a virtual key set on a display screen. In this case, the main screen 1 and/or the secondary screen 2 provided with the virtual key may need to be a touch screen, such that the display device may be operated through the virtual key.

In the configurations described above, each of the main screen 1 and the secondary screen 2 may be moved. In the present disclosure, the size and/or shape of the display area of the display screen may be changed by driving only one of the main screen 1 and the secondary screen 2 to move. For simplicity of description, the present disclosure is concentrated on a configuration that the first drive assembly 3 may drive the secondary screen 2 to move.

Figure 2:
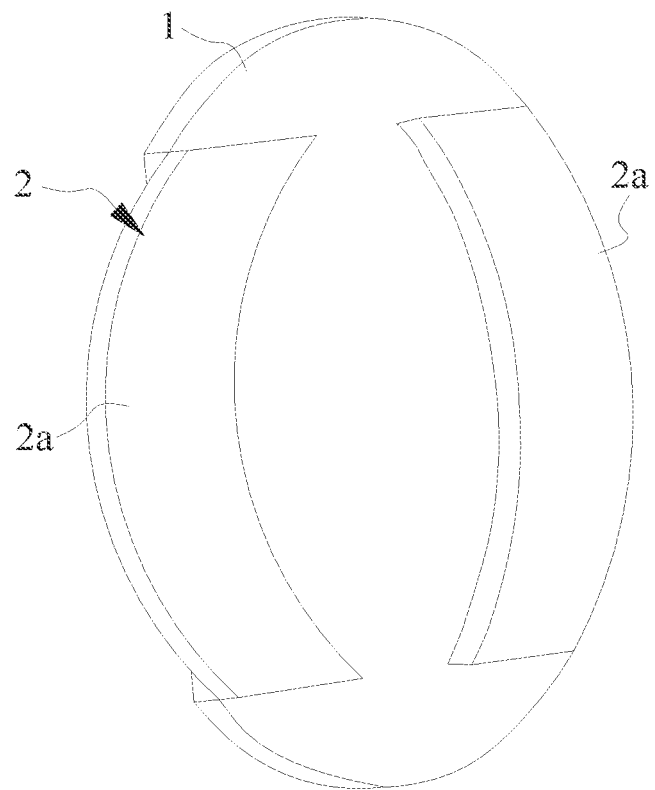
FIG. 2 illustrates a three-dimensional structural diagram of an exemplary first implementation of the display device in a first form, consistent with the disclosed embodiments of the present disclosure.
Figure 3:
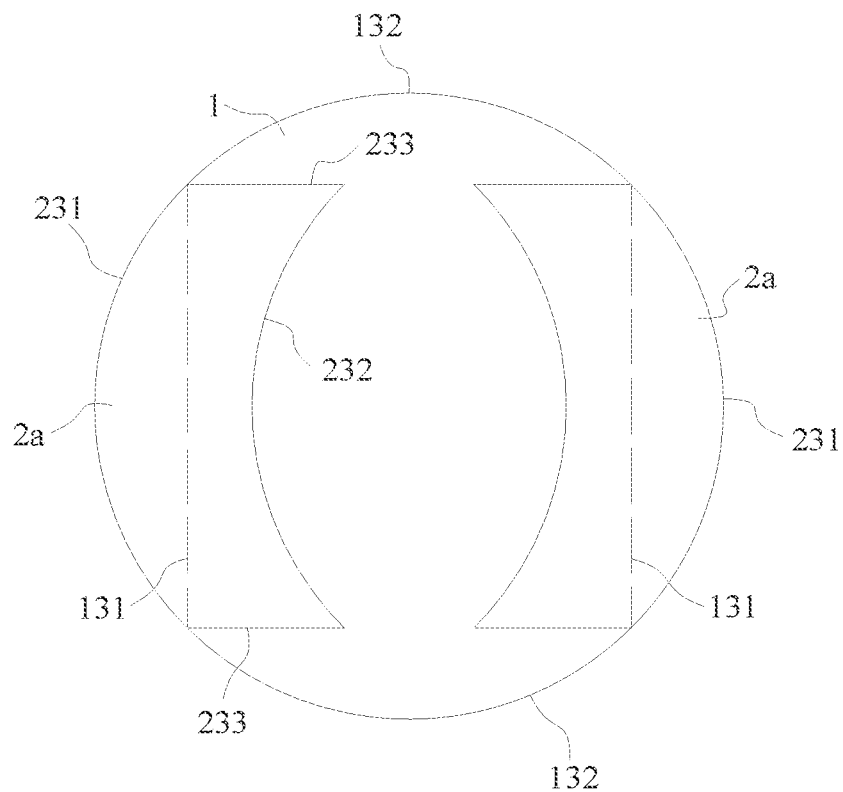
FIG. 3 illustrates a front view of the display device from a perspective of FIG. 2, consistent with the disclosed embodiments of the present disclosure.
Figure 4:
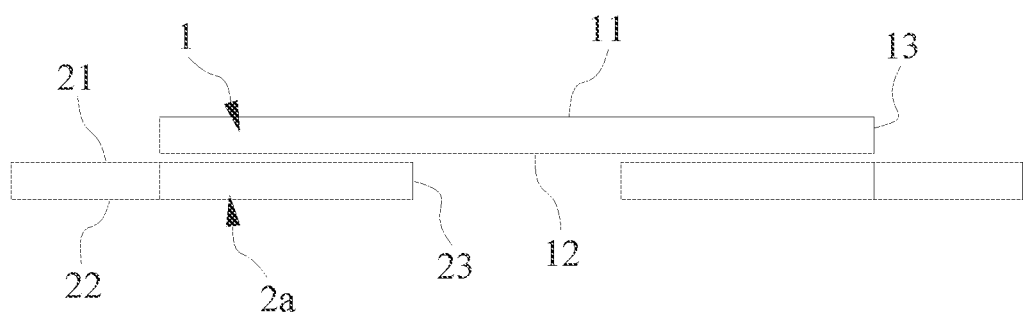
FIG. 4 illustrates a top view of the display device from the perspective of FIG. 2, consistent with the disclosed embodiments of the present disclosure.
Figure 5:
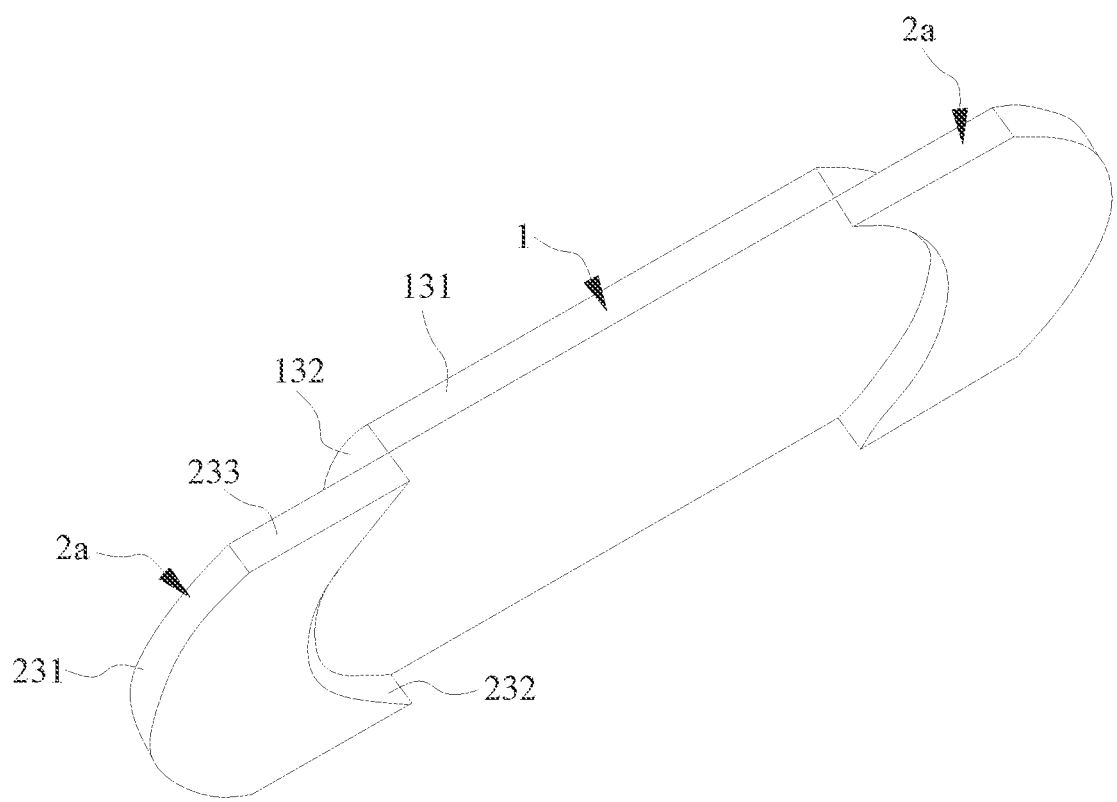
FIG. 5 illustrates a three-dimensional structural diagram of the exemplary first implementation of the display device in a second form, consistent with the disclosed embodiments of the present disclosure.
Figure 6:
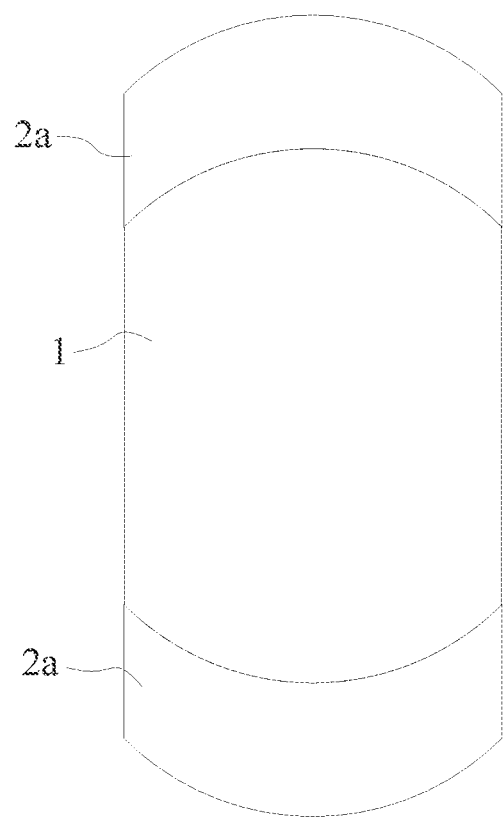
FIG. 6 illustrates a front view of the display device from a perspective of FIG. 5, consistent with the disclosed embodiments of the present disclosure.
Figure 7:
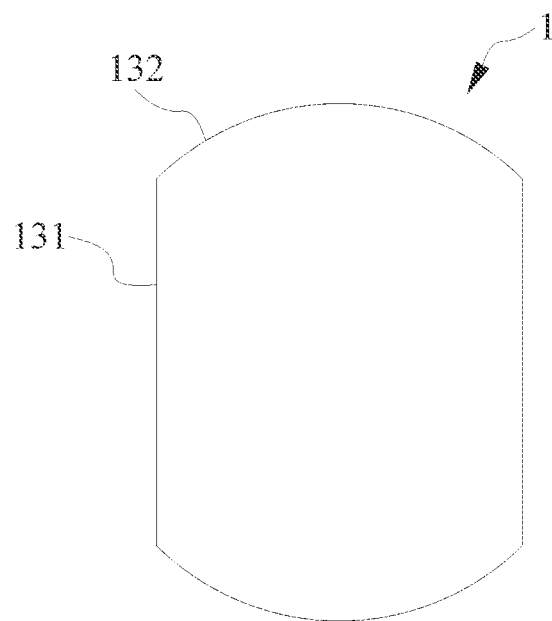
FIG. 7 illustrates a structural diagram of a main screen of the display device, consistent with the disclosed embodiments of the present disclosure.
Figure 8:
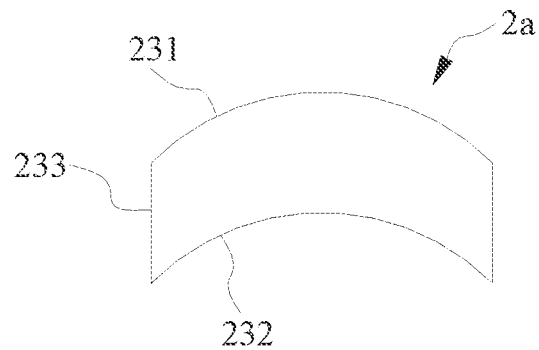
FIG. 8 illustrates a structural diagram of a sub-screen of the display device, consistent with the disclosed embodiments of the present disclosure.
Figure 9:
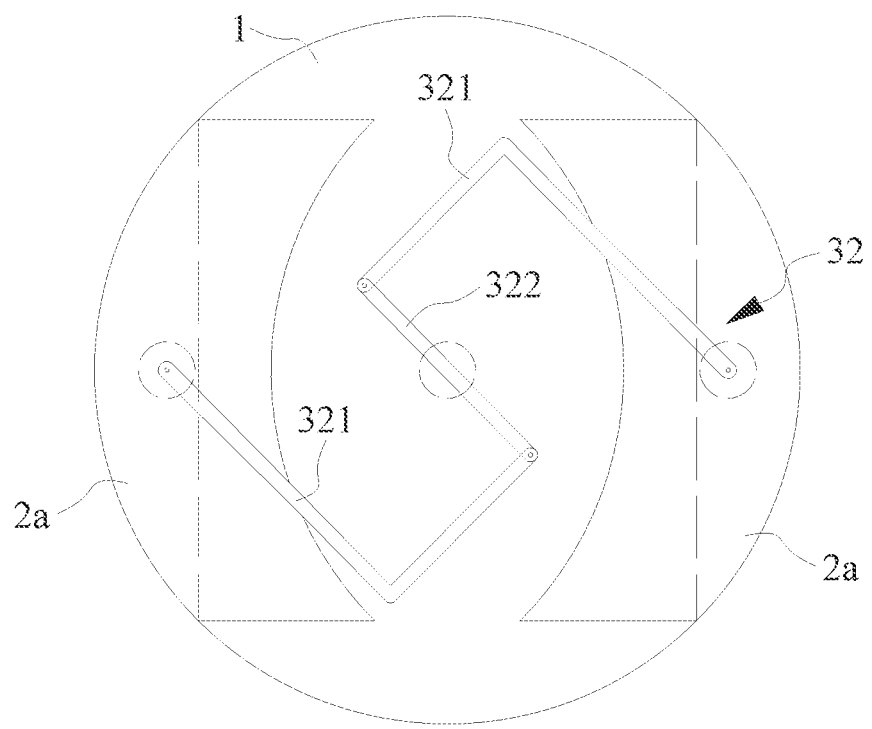
FIG. 9 illustrates a connection structure diagram of the main screen, the secondary screen and the transmission mechanism of the exemplary first implementation of the display device in the first form, consistent with the disclosed embodiments of the present disclosure.
Figure 10:
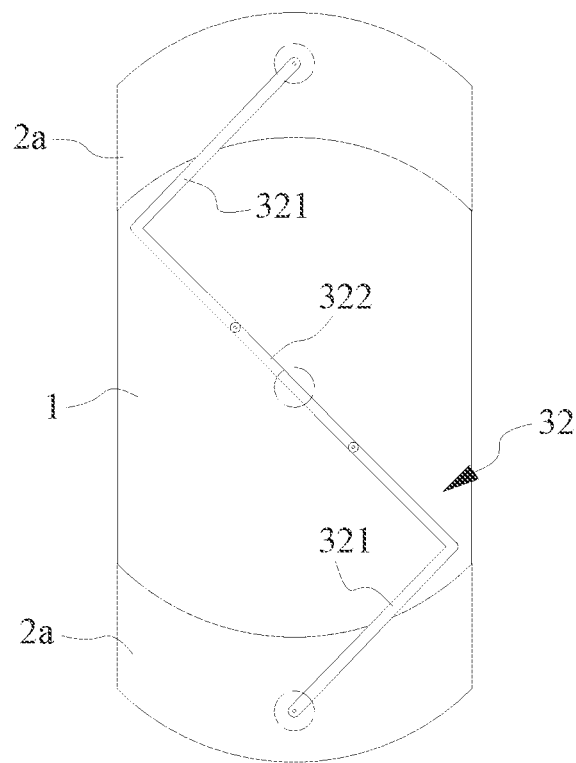
FIG. 10 illustrates a connection structure diagram of the main screen, the secondary screen and the transmission mechanism of the exemplary first implementation of the display device in the second form, consistent with the disclosed embodiments of the present disclosure.

The present disclosure provides an exemplary first implementation of the display device. FIG. 2 illustrates a three-dimensional structural diagram of the exemplary first implementation of the display device in a first form. FIG. 3 illustrates a front view of the display device from a perspective of FIG. 2. FIG. 4 illustrates a top view of the display device from the perspective of FIG. 2. FIG. 5 illustrates a three-dimensional structural diagram of the exemplary first implementation of the display device in a second form. FIG. 6 illustrates a front view of the display device from a perspective of FIG. 5. FIG. 7 illustrates a structural diagram of a main screen of the display device. FIG. 8 illustrates a structural diagram of a sub-screen of the display device. FIG. 9 illustrates a connection structure diagram of the main screen, the secondary screen and the transmission mechanism of the exemplary first implementation of the display device in the first form. FIG. 10 illustrates a connection structure diagram of the main screen, the secondary screen and the transmission mechanism of the exemplary first implementation of the display device in the second form.

In the exemplary first implementation, as shown in FIGS. 2-6, a normal direction of the main screen 1 and a normal direction of the secondary screen 2 may be parallel. In this way, a plane where the main screen 1 is located and a plane where the secondary screen 2 is located may also be parallel.

It may be understood that the normal direction of the main screen 1 refers to a direction perpendicular to the plane where the main screen 1 is located. The normal direction of the secondary screen 2 refers to a direction perpendicular to the plane where the secondary screen 2 is located. The parallelism between the normal direction of the main screen 1 and the normal direction of the secondary screen 2 is substantial parallelism. The parallelism not only includes absolute parallelism, but also includes a situation where a small angle may be formed between the plane where the main screen 1 is located and the plane where the secondary screen 2 is located due to certain assembly errors or manufacturing inaccuracy.

When the first drive assembly 3 drives the secondary screen 2, the secondary screen 2 may move in the plane where the secondary screen 2 is located. Different from a flipping movement, a driving method that makes the secondary screen 2 move in the plane where the secondary screen 2 is located occupies less space. Accordingly, the movement of the secondary screen 2 may not be interfered, and the stability and reliability of the movement of the secondary screen 2 may thus be improved.

The present disclosure does not limit the positional relationship between the main screen 1 and the secondary screen 2 and the movement direction of the secondary screen 2. In some embodiments, the plane where the main screen 1 is located and the plane where the secondary screen 2 is located may also be set at an included angle. The movement of the secondary screen 2 may also be in other directions, such as a direction perpendicular to the plane where the main screen 1 is located.

With reference to FIG. 4, the main screen 1 may include a first display surface 11 and a first back surface 12 oppositely disposed. The first display surface 11 refers to a side of the main screen 1 facing a user when the display device is in a use state. The first display surface 11 may be used to form a first display area of the main screen 1. The first back surface 12 refers to a side of the main screen 1 that faces away from a user when the display device is in a use state. Similarly, the secondary screen 2 may include a second display surface 21 and a second back surface 22 oppositely arranged. The second display surface 21 refers to a side of the secondary screen 2 facing a user when the display device is in a use state. The second display surface 21 may be used to form a second display area of the secondary screen 2. The second back surface 22 refers to a side of the secondary screen 2 that faces away from a user when the display device is in a use state.

Since a thickness of the main screen 1 in the normal direction is substantially same under normal circumstances, the first display surface 11 and the first back surface 12 may be parallel. In this case, each of the first display surface 11 and the first back surface 12 may be set as the plane where the main screen 1 is located. Similarly, the second display surface 21 and the second back surface 22 may be parallel. In this case, each of the second display surface 21 and the second back surface 22 may be set as the plane where the secondary screen 2 is located.

In some embodiments of the present disclosure, each of the first display area and the second display area may be used for display, or only one of the first display area and the second display area may be used for display. Alternatively, one of the first display area and the second display area may be entirely used for display, and the other may be partially used for display. These configurations are specifically related to relative positions of the main screen 1 and the secondary screen 2 in a use state. According to difference in the relative positions of the main screen 1 and the secondary screen 2 in the use state, the display device provided by the present disclosure may present different forms.

In some embodiments of the present disclosure, the display device may have two forms. For ease of description, the two forms are referred to as a first form and a second form, respectively.

In the first form, the secondary screen 2 may be located on the side of the first back surface 12, and the second display surface 21 faces the first back surface 12. In a direction perpendicular to the plane where the main screen 1 is located, the secondary screen 2 and the main screen 1 may at least partially overlap. That is, the secondary screen 2 may be hidden at least partially on the side of the first back surface 12 of the main screen 1, and the second display surface 21 of the secondary screen 2 may be used for display at most partially.

In the second form, the first display surface 11 and the second display surface 21 are in a same direction. The secondary screen 2 and the main screen 1 may not overlap. In this configuration, each of the second display surface 21 and the first display surface 11 may be used for display, and the display area of the display device may be increased.

By switching from the first form to the second form, not only the shape of the display area may be changed, but also the size of the display area may be increased. Accordingly, visual enjoyment of a user may be improved. For a display screen requiring touch operation, operation space of the display device may be increased, and operation convenience of the display device may also be improved.

It may be understood that, in the first form and the second form, the main screen 1 and the secondary screen 2 may be at other relative positions. For example, when the display device is switched from one form to another form, the size of the display area of the display device (that is, the display area that may be directly observed by human eyes) may not change.

In some embodiments of the present disclosure, the main screen 1 may also include a first side surface 13 connecting the first display surface 11 and the first back surface 12. The secondary screen 2 may also include a second side surface 23 connecting the second display surface 21 and the second back surface 22.

As shown in FIG. 7, with reference to FIG. 5, the first side surface 13 may include a first sub-side surface 131 and a second sub-side surface 132 arranged adjacently. As shown in FIG. 8, with reference to FIG. 5, the second side surface 23 may include a third sub-side surface 231 and a fourth sub-side surface 232 arranged oppositely. The fourth sub-side surface 232 and the second sub-side surface 132 have a same extension shape and extension length in a circumferential direction. That is, the shape and size of the orthographic projections of the two sub-side surfaces in the plane where the secondary screen 2 is located are consistent. Through a translation operation, the orthographic projections of the two sub-side surfaces in the plane where the secondary screen 2 is located may be coincident. With reference to FIGS. 7 and 8, when the projection of the third sub-side surface 231 in the plane where the secondary screen 2 is located is an arc segment, the projection of the fourth sub-side surface 232 in the plane where the secondary screen 2 is located may be an arc segment with an equal curvature and an equal arc length. The present disclosure does not limit sizes and shapes of the orthographic projections of the two sub-side surfaces 231 and 232 in the plane where the secondary screen 2 is located. The orthographic projections of the two sub-side surfaces 231 and 232 in the plane where the secondary screen 2 is located may also be straight line segments, or non-straight line segments of other shapes.

In the first form, along the direction perpendicular to the plane where the main screen 1 is located, the first sub-side 131 may be located in the secondary screen 2. That is, an orthographic projection of the first sub-side surface 131, along the direction perpendicular to the plane where the secondary screen 2 is located, is in the secondary screen 2. In the direction perpendicular to the plane where the main screen 1 is located, the third sub-side surface 231 and the main screen 1 may at least partially not overlap. That is, the third sub-side surface 231 may be at least partially exposed. In the direction perpendicular to the plane where the main screen 1 is located, the fourth sub-side surface 232 is at least partially located in the main screen 1. That is, the fourth sub-side surface 232 may be at least partially hidden on the side of the first back surface 12 of the main screen 1.

In the second form, along the direction perpendicular to the plane where the main screen 1 is located, the fourth sub-side surface 232 is in contact with the second sub-side surface 132. That is, the fourth sub-side surface 232 and the second sub-side surface 132 are joined with a small gap in the direction perpendicular to the main screen 1. In this way, the second display surface 21 may be completely exposed. Meanwhile, the gap between the second sub-side surface 132 and the fourth sub-side surface 232 may be maintained to be small, and thus the influence of the gap on the display may be reduced. In addition, since the extension shapes and extension lengths of the fourth sub-side surface 232 and the second sub-side surface 132 in the circumferential direction may be same, the fourth sub-side surface 232 and the second sub-side surface 132 may be perfectly matched after abutting. Each of the fourth sub-side surface 232 and the second sub-side surface 132 may have no redundancy in the circumferential direction. Accordingly, the gap between the fourth sub-side surface 232 and the second sub-side surface 132 may be uniform, the aesthetics of the product may be improved, and the influence of the gap on display may be reduced.

It should be noted that the display device provided by the present disclosure includes two screens, the main screen 1 and the secondary screen 2. When the main screen 1 and the secondary screen 2 are in contact, the gap between the main screen 1 and the secondary screen 2 may not be strictly eliminated. In actual operations, the influence of the gap on the display may be reduced by means of integrated circuit (IC) control or drive control, and the display quality of the display device may thus be improved.

In some embodiments, in the first form, the third sub-side surface 231 and the main screen 1 may not overlap. That is, the third sub-side surface 231 may be entirely exposed. The fourth sub-side surface 232 may be entirely located in the main screen 1. That is, the fourth sub-side surface 232 may be entirely hidden on the first back 12 side of the main screen 1. As shown in FIG. 3, along the direction perpendicular to the plane where the main screen 1 is located, the second sub-side surface 132 and the third sub-side surface 231 may be in contact with each other. That is, the orthographic projection of the second sub-side surface 132 in the plane where the main screen 1 is located and the orthographic projection of the third sub-side surface 231 in the plane where the main screen 1 is located may be connected. Accordingly, the uniformity of the circumferential edge of the display device may be improved, the aesthetics of the display device may be increased, and the design of the outer frame of the display device may be simplified.

Referring to FIG. 1, the secondary screen 2 may include only one screen. Alternatively, the secondary screen 2 may include a plurality of sub-screens 2a. In this case, the display device may include only one first drive assembly 3, and the first drive assembly 3 may simultaneously drive each sub-screen 2a to move. Of course, the number of the first drive assemblies 3 and the number of the sub-screens 2a may set to be same, such that a one-to-one driving connection relationship between the first drive assemblies 3 and the sub-screens 2a may be achieved. Specifically, in one embodiment, a scheme that one single first drive assembly 3 simultaneously drives a plurality of sub-screens 2a to move is preferably adopted, such that the number of the first driving assemblies 3 may be reduced, and the structure of the display device may thus be simplified.

The above-described limitations for the secondary screen 2 on the number of sub-screens 2a and the corresponding relationship between the sub-screens 2a and the first drive assembly 3 are also applicable to the main screen 1, and are not repeated here.

As shown in FIGS. 2-10, in some embodiments, the secondary screen 2 may include two sub-screens 2a arranged opposite to each other. Each of the second side surfaces 23 of the sub-screens 2a may include a third sub-side surface 231 and a fourth sub-side surface 232. The second side surface 23 of the sub-screens 2a may also include two fifth sub-side surfaces 233 connecting the third sub-side surface 231 and the fourth sub-side surface 232. Along the direction perpendicular to the plane where the main screen 1 is located, each of the first sub-side 131 and the fifth sub-side 233 may have a straight shape. The first side surface 13 may include two first sub-side surfaces 131 arranged oppositely and two second sub-side surfaces 132 arranged oppositely. In the second form, the two first sub-side surfaces 131 and the two fifth sub-side surfaces 233 are connected in a one-to-one correspondence, and are coplanar.

The present disclosure does not limit the shapes of the first sub-side surface 131, the third sub-side surface 231 and the fourth sub-side surface 232. The shapes of the first sub-side surface 131, the third sub-side surface 231 and the fourth sub-side surface 232 may be configured according to actual needs. As shown in FIGS. 2-10, in some embodiments, in the direction perpendicular to the plane where the main screen 1 is located, each of the first sub-side 131, the third sub-side surface 231 and the fourth sub-side surface 232 may exhibit as an arc segment, and the length of the arc segment may be approximately ¼ of a full circle. Based on this structural design, with reference to FIG. 3, in the first form, the arc-shaped third sub-side surface 231 and the arc-shaped second sub-side surface 132 may be connected to form a circular display area. In this case, the display device may be used for watch display, conforming to the design structure of a conventional round watch. With reference to FIG. 6, in the second form, the display area may exhibit as a long strip, and the display area may be increased. In this case, the display device may be used for wristband display, conforming to the design structure of a conventional elongated wristband.

With reference to FIG. 3 and FIG. 6, when switching between the first form and the second form, the sub-screens 2a is rotated by 90 degrees. Meanwhile, the distance of the sub-screens 2a relative to the center of the main screen 1 is also increased. When the sub-screens 2a is rotated, the display direction of the texts on the sub-screens 2a is changed. The change of the display direction of the texts may be adjusted through IC control, drive control, etc. As a result, no matter where the sub-screens 2a is located, the sub-screens 2a may have a same display direction as the main screen 1, and thus the consistency of the display directions at various positions of the entire display screen may be achieved.

In the present disclosure, to improve the accuracy of the movement of the sub-screens 2*a* in each form, the display device may be configured with position-limiting components. These position-limiting components may include various forms of position-limiting elements, such as position-limiting plates and position-limiting blocks.

The structural configuration of the first drive assembly 3 is related to the movement types of the secondary screen 2. Different driving elements may be used for different movement types. For example, when the movement type required by the secondary screen 2 is a rotational movement, the driving element may be a motor, a rotary cylinder, a rotary oil cylinder, or other elements that may directly output a rotational movement. When the movement type required by the secondary screen 2 is a linear movement, the driving element may be a linear cylinder, a linear oil cylinder or other elements that may directly output a linear movement. Alternatively, elements that may directly output rotational movement, such as a motor, a rotary cylinder, a rotary oil cylinder, etc., may also be used. At this time, a transmission structure in a form of a rack and pinion mechanism, or a screw mechanism, etc., may also be used to convert the output rotational movement into a linear movement. When the required movement type of the secondary screen 2 includes linear movement and rotational movement, a combination of various types of driving elements may be used to meet the driving requirements.

In the present disclosure, a motor is preferably used as the driving element of the first drive assembly 3 mainly due to following advantages. A motor may have a simple structure, and no complicated oil circuit and gas circuit design is required. A motor may be used directly after being connected to electricity. A motor may have a fast response speed, and may be conveniently controlled for start and stop.

For ease of description, the positional movements of the sub-screens 2*a* relative to the main screen 1 in the two forms shown in FIG. 3 and FIG. 6 are taken as an example. To switch from the first form shown in FIG. 3 to the second form shown in FIG. 6, the required movement type of the sub-screens 2*a* includes: rotation 90 degrees+linear movement (extending relative to the main screen 1, so as to expose the sub-screens 2*a* completely). Based on this, a rotary movement mechanism and a linear movement mechanism may be set at a same time to realize the requirement movement operation. During the driving control, the rotary movement mechanism and the linear movement mechanism may be driven successively. That is, one of the linear movement and the rotational movement may be completed first, and then the other of the linear movement and the rotational movement may be completed. Of course, the rotational movement mechanism and the linear movement mechanism may be driven simultaneously to perform the rotational movement and the linear movement simultaneously.

Alternatively, in one embodiment, the above movement may also be realized by means of a motor 31+a transmission mechanism 32. With reference to FIGS. 9 and 10, the transmission mechanism 32 may include two L-shaped transmission rods 321, and the plane where the transmission rods 321 are located may be parallel to the plane where the sub-screen 2*a* is located. The L-shaped transmission rod 321 may include two connection arms arranged at an included angle. Axes of the two connection arms are connected to form a plane where the transmission rod 321 is located. The movement direction of the sub-screen 2*a* may be determined by setting the surface where the transmission rod 321 is located and the surface where the sub-screens 2*a* is located to be parallel. One end of the transmission rod 321 may be directly or indirectly connected to the sub-screen 2*a*. The other end of the transmission rod 321 may be used as a power input end for connecting with the motor 31. In this way, the rotational torque output by the motor 31 may act on the sub-screen 2*a* through the transmission rod 321, such that the sub-screen 2*a* may be driven to synchronously complete the above-mentioned linear movement+rotational movement.

With this solution, through the transmission rod 321, by using only one driving element (the motor 31), two forms of movements may be synchronously realized. In addition, this configuration has a simple structure.

In some optional embodiments, the transmission mechanism 32 may further include a support body 322. The power input ends of the two transmission rods 321 may be rotatably connected to the support body 322. The support body 322 may have a rod shape, or other structural forms. The support body 322 may be used to provide support for the transmission rods 321 to keep the structural stability of the transmission mechanism 32.

Each of the power input ends of the two transmission rods 321 may be connected to one motor 31. In this case, the display device may include two motors 31. In some other embodiments, the display device may use only one motor 31. The power of the motor 31 may be synchronously transmitted to the two transmission rods 321 through transmission components in forms of gears, sprockets, pulleys, etc.

It should be noted that the circular dotted lines at the end of the transmission rod 321 in FIGS. 9 and 10 only schematically represent the connection position of the transmission rod 321 and the sub-screens 2*a*. In FIGS. 9 and 10, the circular dotted line located approximately in the middle of the support body 322 only schematically represents a fixing position of the stationary rod 322, and does not represent an actual shape of any part.

In the exemplary first implementation shown in FIGS. 2-10, the secondary screen 2 and the main screen 1 may be staggered in the direction perpendicular to the plane where the main screen 1 is located. As a result, the first display surface 11 and the second display surface 21 may not be coplanar.

Figure 11:
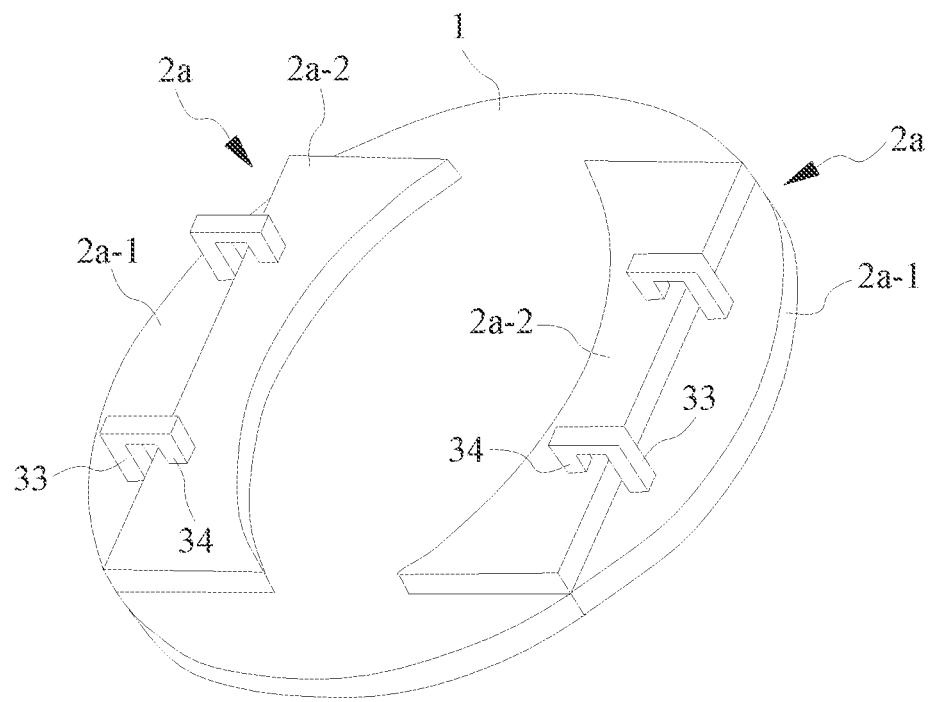
FIG. 11 illustrates a connection structure diagram of the main screen, the secondary screen and the two telescopic mechanisms of an exemplary second implementation of the display device in the first form, consistent with the disclosed embodiments of the present disclosure.
Figure 12:
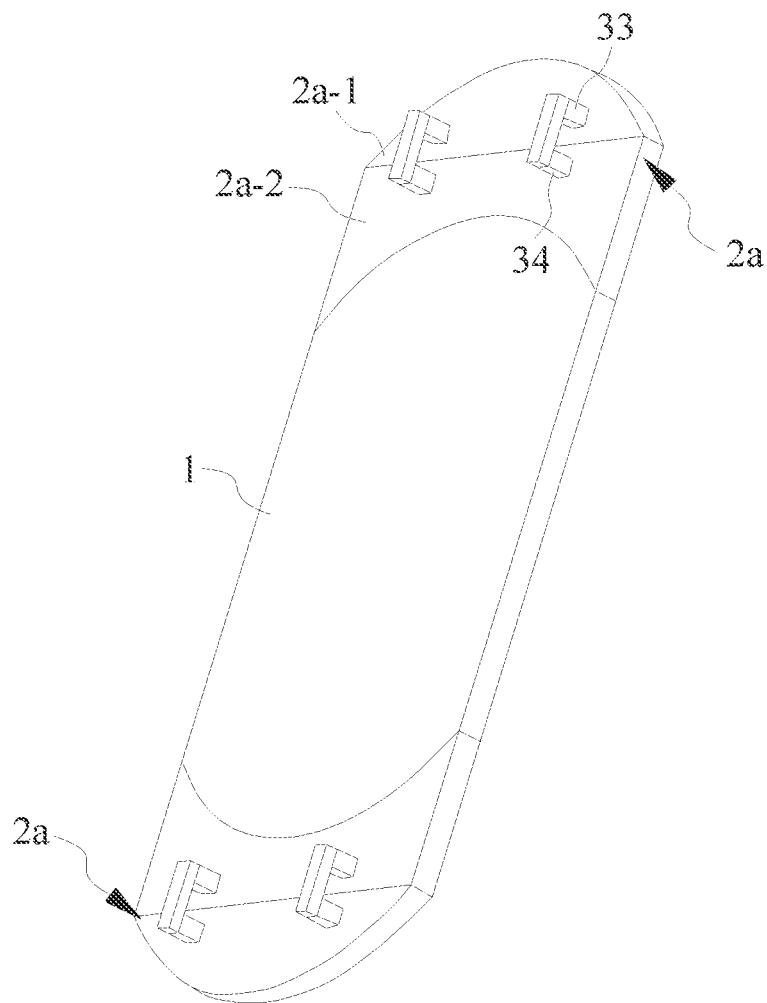
FIG. 12 illustrates a connection structure diagram of the main screen, the secondary screen and the two telescopic mechanisms of the exemplary second implementation of the display device in the second form, consistent with the disclosed embodiments of the present disclosure.
Figure 13:
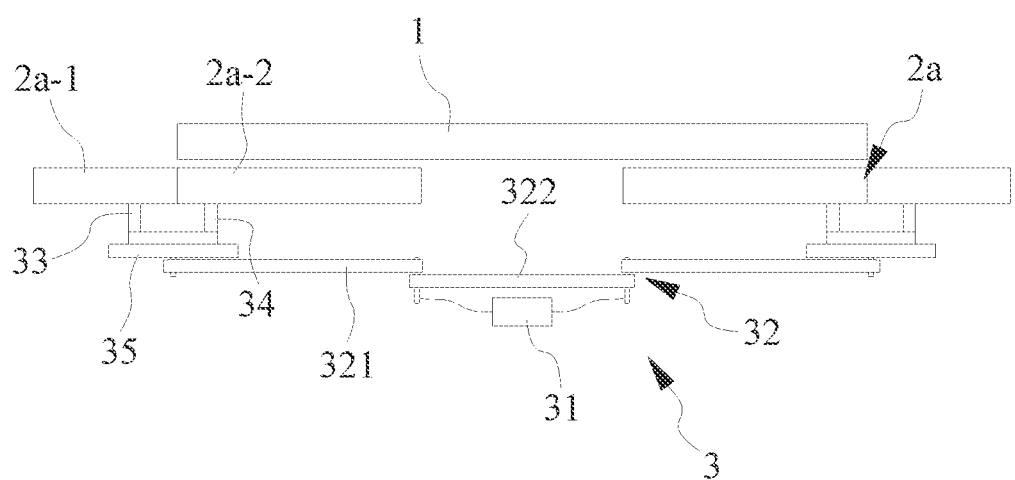
FIG. 13 illustrates a connection structure diagram of the main screen, the secondary screen and the first drive assembly of the exemplary second implementation of the display device, consistent with the disclosed embodiments of the present disclosure.

The present disclosure also provides an exemplary second implementation. FIG. 11 illustrates a connection structure diagram of the main screen, the secondary screen and the two telescopic mechanisms of the exemplary second implementation of the display device in the first form. FIG. 12 illustrates a connection structure diagram of the main screen, the secondary screen and the two telescopic mechanisms of the exemplary second implementation of the display device in the second form. FIG. 13 illustrates a connection structure diagram of the main screen, the secondary screen and the first drive assembly of the exemplary second implementation of the display device.

As shown in FIGS. 11-12, in one embodiment, the secondary screen 2 may include a first screen part 2*a*-1 and a second screen part 2*a*-2 that are split form each other. Each of the first screen part 2*a*-1 and the second screen part 2*a*-2 may include a second display surface 21 and a second back surface 22 oppositely disposed. The display device may also have a first form and a second form.

As shown in FIG. 13, the first drive assembly 3 may also include a first telescopic mechanism 33 and a second telescopic mechanism 34. The first telescopic mechanism 33 may be connected to the first screen part 2a-1 to drive the first screen part 2a-1 to move in a direction perpendicular to a plane where the first screen part 2a-1 is located. The second telescopic mechanism 34 may be connected to the second screen part 2a-2 to drive the second screen part 2a-2 to move in a direction perpendicular to the plane where the second screen part 2a-2 is located.

With reference to FIG. 11, in the first form, the second display surface 21 of the first screen part 2a-1 is in a same direction as the first display surface 11. Moreover, under the action of the first telescopic mechanism 33, the first screen part 2a-1 and the main screen 1 may be coplanar. That is, the second display surface 21 of the first screen part 2a-1 and the first display surface 11 of the main screen 1 may be coplanar. The second display surface 21 of the second screen part 2a-2 is in a same direction as the first display surface 11. Moreover, in a direction perpendicular to the plane where the main screen 1 is located, the second screen part 2a-2 is located within the main screen 1. That is, the second screen part 2a-2 may be entirely hidden on the side of the first back face 12 of the main screen 1.

Referring to FIG. 12, in the second form, each of the first screen part 2a-1 and the second screen part 2a-2 may be exposed to the main screen 1 to maximize the area of the display area. Specifically, the second screen part 2a-2 may be located between the first screen part 2a-1 and the main screen 1. Each of the second display surfaces 21 of the first screen part 2a-1 and the second screen part 2a-2 may be oriented in a same direction as the first display surface 11. Moreover, the first screen part 2a-1, the second screen part 2a-2 and the main screen 1 are coplanar. That is, the second display surfaces 21 of the two screen parts may be coplanar with the first display surface 11 of the main screen 1.

Specifically, when switching from the first form to the second form, the first telescopic mechanism 33 may first control the first screen part 2a-1 to move in a direction from the second display surface 21 to the second back surface 22, until the first screen part 2a-1 and the main screen 1 are staggered from each other in the direction perpendicular to the plane where the main screen 1 is located. Then, the first screen part 2a-1 and the second screen part 2a-2 are controlled to perform a rotational movement and/or linear movement in the plane where the secondary screen 2 is located. In this way, interference between the first screen part 2a-1 and the main screen 1 may be avoided. After the first screen part 2a-1 and the second screen part 2a-2 are displaced in place in the plane where the secondary screen 2 is located, the first telescopic mechanism 33 may control the first screen part 2a-1 to move in the direction of the second back surface 22 toward the second display surface 21. The second telescopic mechanism 34 may control the second screen part 2a-2 to move in the direction of the second back face 22 toward the second display surface 21. Accordingly, the second display surfaces 21 of the first screen part 2a-1 and the second screen part 2a-2 may be adjusted to be coplanar with the first display surface 11 of the main screen 1. A switching process from the second form to the first form is opposite to the switching process from the first form to the second form as described above, and the switching process from the second form to the first form is not described in detail here. In the present disclosure, a "rotational movement and/or linear movement" specifically refers to: a rotational movement, or a linear movement, or a rotational movement and a linear movement.

The first telescopic mechanism 33 and the second telescopic mechanism 34 are mainly used to realize the linear movement. As such, each of the two telescopic mechanisms may use a driving component capable of realizing a linear movement. For example, linear cylinders, linear oil cylinders and other components that may directly output a linear movement may be used. Alternatively, components that may directly output a rotational movement, such as a motor, a rotary cylinder, and a rotary oil cylinder, may also be used. At this time, a transmission structure in a form of a rack and pinion mechanism, a screw mechanism, or the like, may be used to convert the rotational movement into a linear movement. Preferably, each of the two telescopic mechanisms mentioned above may use a solution of a motor with a transmission structure, mainly due to following advantages. A motor may have a simple structure, and no complicated oil circuit and gas circuit design may be required. A motor may be used directly after being connected to electricity. A motor may have a fast response speed, and may be conveniently controlled for start and stop.

In some optional embodiments, the display device provided by the present disclosure may also include a mounting frame 35. Each of the first telescopic mechanism 33 and the second telescopic mechanism 34 matched with a same sub-screens 2a may be arranged on the mounting frame 35 to provide support for the two telescopic mechanisms. In this case, the two screen parts of the same sub-screens 2a and the two telescopic mechanisms and the mounting frame 35 may form a component, and thus the convenience of assembly may be improved. With reference to FIG. 13, the component may be directly connected to the transmission rod 321. Specifically, the transmission rod 321 may be directly connected to the mounting frame 35, such that the component may be moved synchronously, and the structure of the display device may thus be simplified.

In the above solution, since the sub-screens 2a includes the first screen part 2a-1 and the second screen part 2a-2 that are split, a gap may exist at a connection place between the first screen part 2a-1 and the second screen part 2a-2. The influence of the gap on the display may be reduced by means of IC control or drive control, and the display quality may thus be improved.

Figure 14:
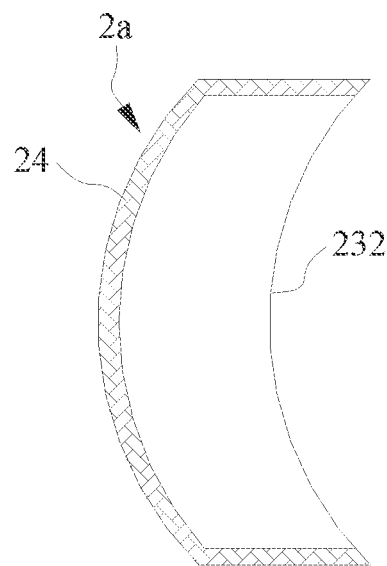
FIG. 14 illustrates a schematic structural diagram of a sub-screen configured with a secondary screen frame, consistent with the disclosed embodiments of the present disclosure.
Figure 15:
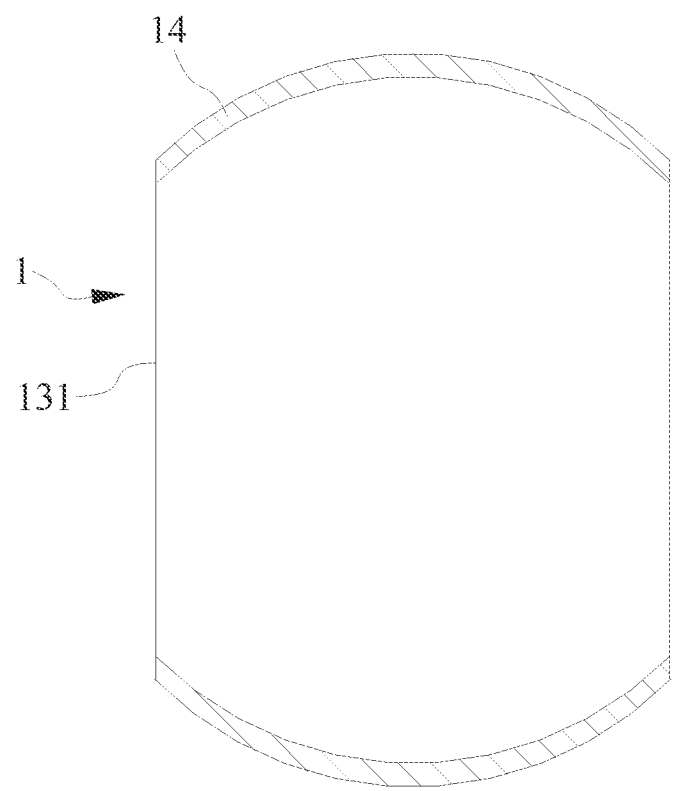
FIG. 15 illustrates a schematic structural diagram of a main screen configured with a movable frame in a first form, consistent with the disclosed embodiments of the present disclosure.
Figure 16:
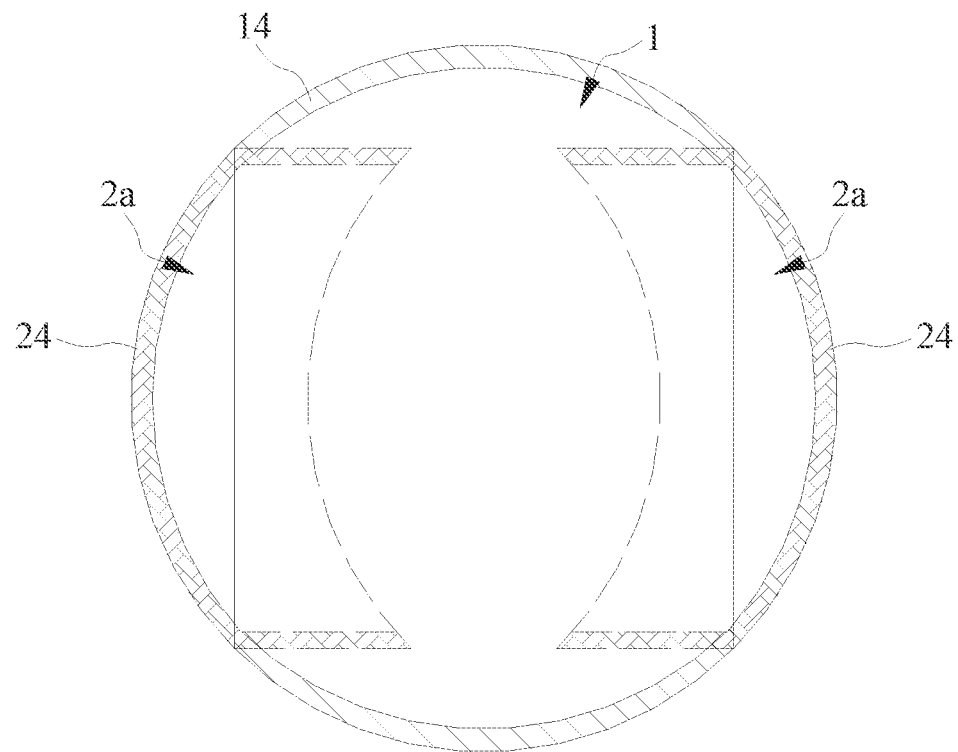
FIG. 16 illustrates a schematic structural diagram of a combination of the sub-screen illustrated by FIG. 14 and the main screen illustrated by FIG. 15 in the first form, consistent with the disclosed embodiments of the present disclosure.
Figure 17:
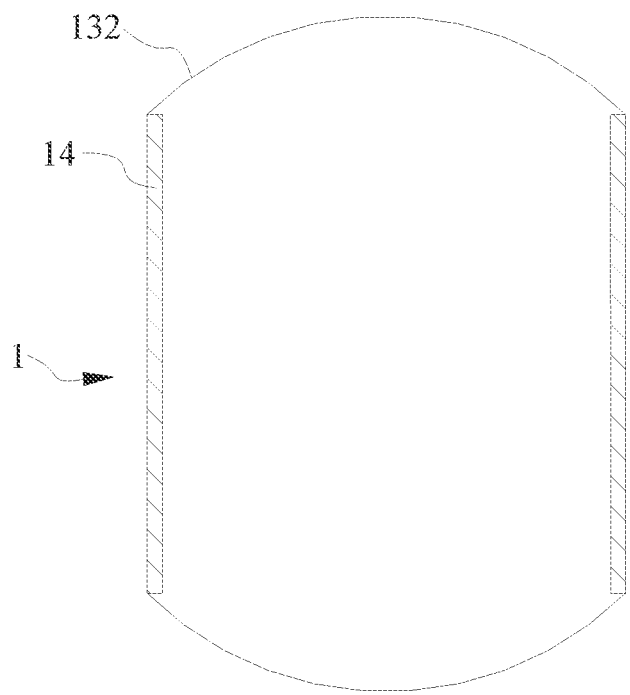
FIG. 17 illustrates a schematic structural diagram of the main screen configured with a movable frame in the second form, consistent with the disclosed embodiments of the present disclosure.
Figure 18:
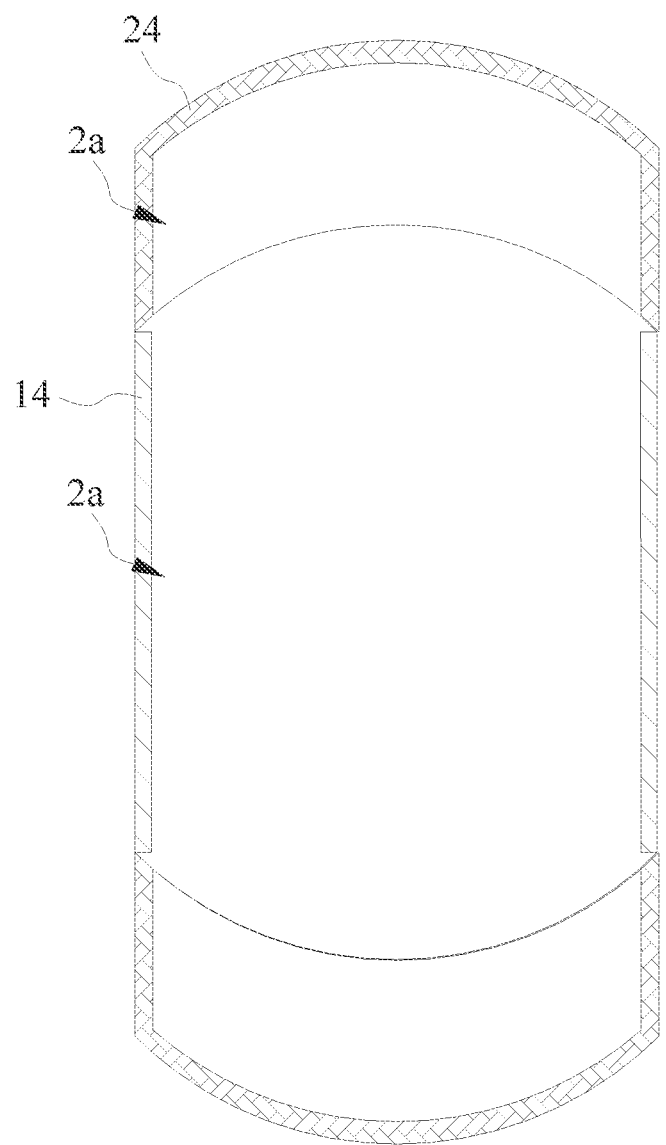
FIG. 18 illustrates a schematic structural diagram of a combination of the sub-screen illustrated by FIG. 14 and the main screen illustrated by FIG. 17 in the second form, consistent with the disclosed embodiments of the present disclosure.
Figure 19:
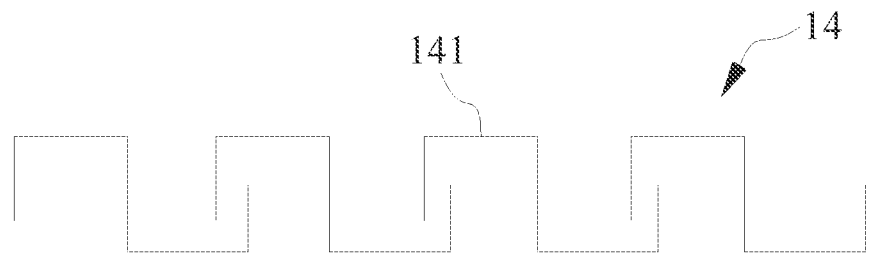
FIG. 19 illustrates a schematic structural diagram of the movable frame with an adjustable length, consistent with the disclosed embodiments of the present disclosure.

The present disclosure also provides a design of an outer frame of the display device. FIG. 14 illustrates a schematic structural diagram of a sub-screen configured with a secondary screen frame. FIG. 15 illustrates a schematic structural diagram of the main screen configured with a movable frame in the first form. FIG. 16 illustrates a schematic structural diagram of a combination of the sub-screen illustrated by FIG. 14 and the main screen illustrated by FIG. 15 in the first form. FIG. 17 illustrates a schematic structural diagram of the main screen configured with a movable frame in the second form. FIG. 18 illustrates a schematic structural diagram of a combination of the sub-screen illustrated by FIG. 14 and the main screen illustrated by FIG. 17 in the second form. FIG. 19 illustrates a schematic structural diagram of the movable frame with an adjustable length.

As shown in FIG. 14, the secondary screen 2 may be configured with a sub-screen frame 24. The sub-screen frame 24 may be used to cover the area of the outer periphery of the secondary screen 2 except the fourth sub-side surface 232. A movable frame 14 may be provided in a part of the outer periphery area of the main screen 1. That is, the movable frame 14 may not entirely cover the first side surface 13 of the main screen 1. In some optional embodiments, the display device provided by the present disclosure may also include a second drive assembly (not shown in FIG. 14). The second drive assembly may be connected to the movable frame 14 for driving the movable frame 14 to move along the outer periphery of the main screen 1, such that the setting position of the movable frame 14 in the circumferential direction of the main screen 1 may be adjusted.

The present disclosure does not limit the structural configuration of the second drive assembly. The structural configuration of the second drive assembly may be determined according to specific requirements, as long as the above-mentioned technical effects may be achieved. It may be understood that the second drive assembly may be used to realize the movement of the movable frame 14 in the circumferential direction of the main screen 1. Accordingly, the second drive assembly may use a solution of combining a motor with a transmission structure. The present disclosure does not limit a specific form of the transmission structure.

With reference to FIG. 15, in the first form, the movable frame 14 may be used to cover the second sub-side surface 132. As shown in FIG. 16, in the first form, when the second sub-side surface 132 and the third sub-side surface 231 are in contact with each other in the circumferential direction, the part of the sub-screen frame 24 covering the third sub-side surface 231 and the movable frame 14 may also be connected in the circumferential direction to form a complete frame in the first form. Accordingly, in the first form, the display device provided by the present disclosure may be configured with a frame, at each position in the circumferential direction.

With reference to FIG. 17, under the action of the second drive assembly, in the second form, the movable frame 14 may be moved to a state of covering the first sub-side surface 131. In this case, in the second form, when the first sub-side surface 131 and the fifth sub-side 233 are connected in the circumferential direction, the secondary screen frame 24 and the movable frame 14 may also be connected in the circumferential direction to form a complete frame in the second form. Accordingly, the display device provided by the present disclosure may be configured with a frame, at each position in the circumferential direction in the second form. Moreover, in the second form, each of the fourth sub-side surface 232 and the second sub-side surface 132 is not configured with a frame. After the fourth sub-side surface 232 and the second sub-side surface 132 are connected, the influence of the frame on the display quality at the connection position of the fourth sub-side surface 232 and the second sub-side surface 132 may be reduced.

Extension dimensions of the first sub-side surface 131 and the second sub-side surface 132 in the circumferential direction may be same or different. When the extension dimensions of the first sub-side surface 131 and the second sub-side surface 132 in the circumferential direction are different, the length of the movable frame 14 may be set to be adjustable. Accordingly, in each of the first form and the second form, the movable frame 14 may completely cover the corresponding sub-side surface and redundancy may be avoided.

In one embodiment, the adjustable length of the movable frame 14 may be realized by using a material with certain elasticity.

In some other embodiments, as shown in FIG. 19, the movable frame 14 may include a plurality of sub-frames 141. The sub-frames may be connected by elastic members in forms of springs and the like. In this way, under action of different external forces, the distance between the adjacent two sub-frames 141 may be different, such that the length of the movable frame 14 may be changed. The external force may rely on the traction force generated by the second drive assembly.

In some other embodiments, the two adjacent sub-frames 141 may be configured with electromagnets. By adjusting the magnitude of current, the magnetic attraction force (or the magnetic repulsion force) output by the electromagnet may be changed. Accordingly, the distance between two adjacent sub-frames 141 may be changed, and the length of the movable frame 14 may thus be changed.

Figure 20:
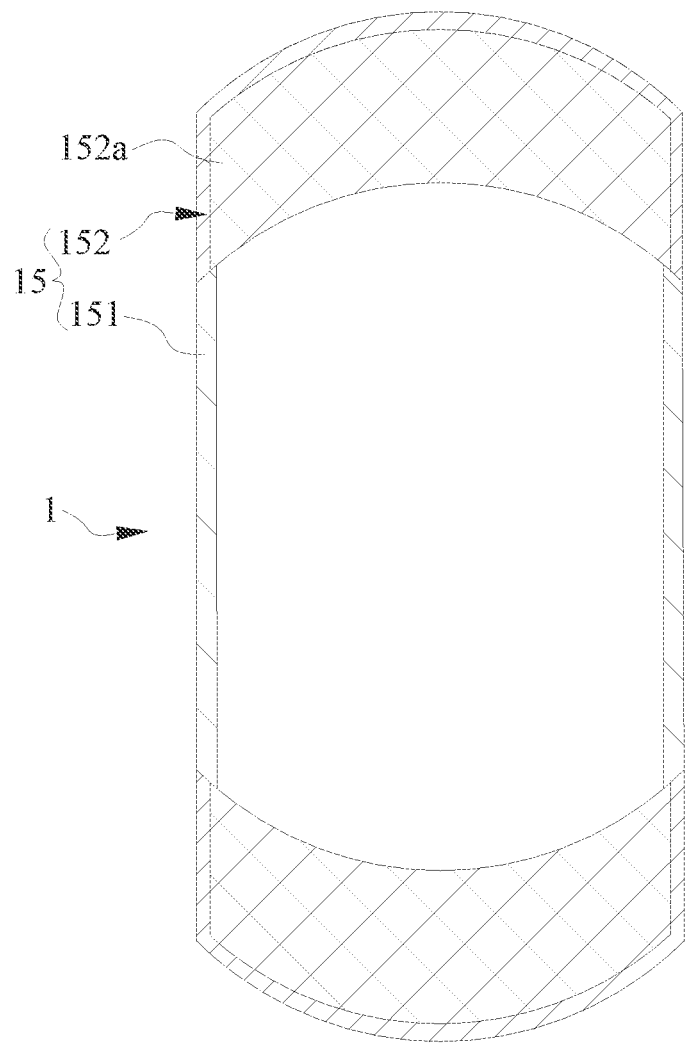
FIG. 20 illustrates a schematic structural diagram of a main screen configured with a reversible frame segment and a fixed frame segment, consistent with the disclosed embodiments of the present disclosure.
Figure 21:
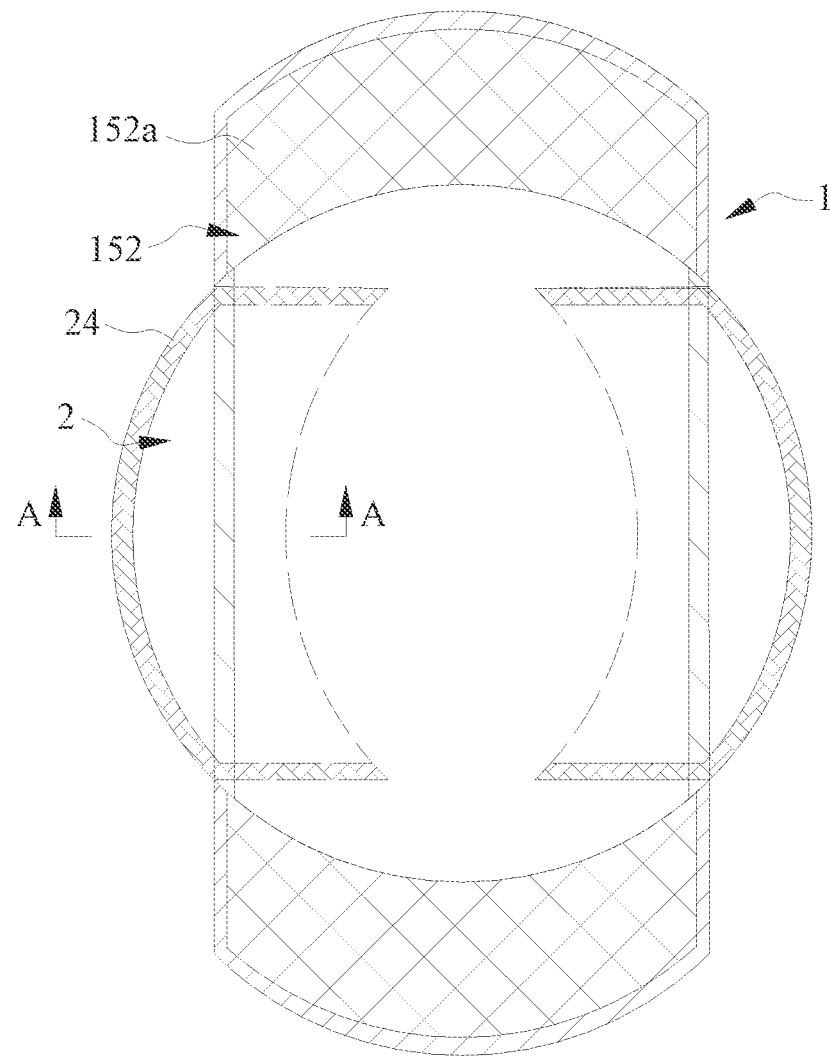
FIG. 21 illustrates a schematic structural diagram of a combination of the sub-screen illustrated by FIG. 14 and the main screen illustrated by FIG. 20 in the first form, consistent with the disclosed embodiments of the present disclosure.
Figure 22:
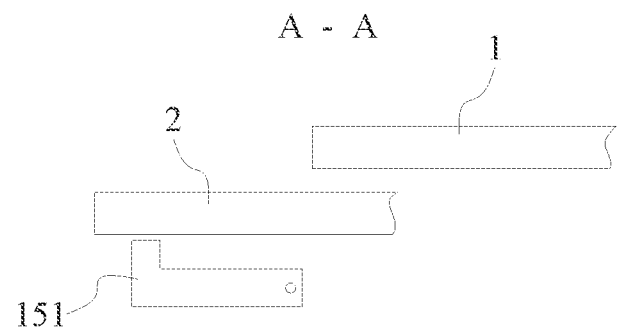
FIG. 22 illustrates a partial view of FIG. 21 in A-A direction, consistent with the disclosed embodiments of the present disclosure.
Figure 23:
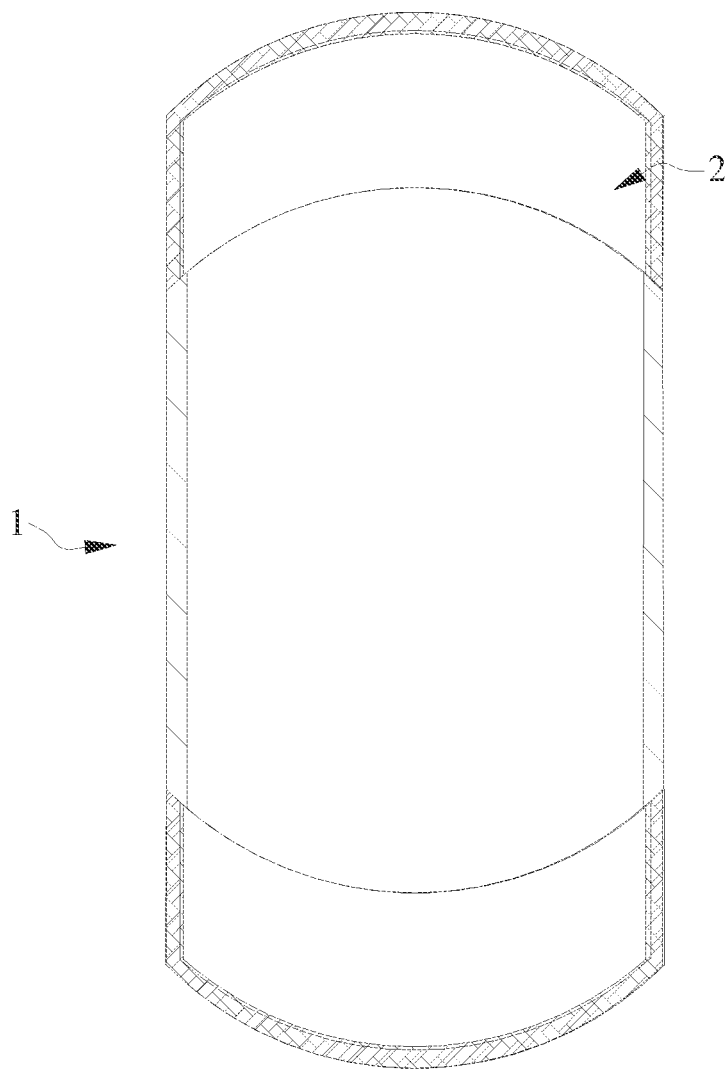
FIG. 23 illustrates a schematic structural diagram of the combination of the sub-screen illustrated by FIG. 14 and the main screen illustrated by FIG. 20 in the second form, consistent with the disclosed embodiments of the present disclosure.

The present disclosure also provides another implementation to realize the frame arrangement of the display device in different forms. FIG. 20 illustrates a schematic structural diagram of a main screen configured with a reversible frame segment and a fixed frame segment. FIG. 21 illustrates a schematic structural diagram of a combination of the sub-screen illustrated by FIG. 14 and the main screen illustrated by FIG. 20 in the first form. FIG. 22 illustrates a partial view of FIG. 21 in A-A direction. FIG. 23 illustrates a schematic structural diagram of the combination of the sub-screen illustrated by FIG. 14 and the main screen illustrated by FIG. 20 in the second form.

As shown in FIG. 20, the outer periphery of the main screen 1 may be provided with a main screen frame 15. The main screen frame 15 may cover the entire first side surface 13. The part of the main screen frame 15 for covering the first sub-side surface 131 is a reversible frame segment 151. The reversible frame segment 151 has a covering state covering the first sub-side surface 131 and a flipped state separating from the first sub-side surface 131. In the flipped state, the reversible frame segment 151 may release the covering of the first sub-side surface 131, such that the first sub-side surface 131 is in a bare state. The part of the main screen frame 15 for covering the second sub-side surface 132 is a fixed frame segment 152. The fixed frame segment 152 may not only cover the second sub-side surface 132, but also have an extension portion with a certain extension size in the direction away from the center of the main screen 1. The extension portion may be used for the secondary screen 2 in the second form. The fixed frame segment 152 may also include a shielding part 152a. The shielding part 152a has a shielding state and an open state. In the shielding state, the shielding part 152a may shield internal components of the fixed frame segment 152. In the open state, the internal components of the fixed frame segment 152 may be exposed, for example, the secondary screen 2 in the second form may be exposed.

The shielding part 152a may be made of a flexible material, and may be configured with a corresponding driving element to realize the unfolding and rolling of the shielding part 152a. When the shielding part 152a is unfolded, the shielding part 152a may be in a shielding state. When the shielding part 152a is rolled up, the shielding part 152a may be in an open state.

The secondary screen 2 may be configured with a secondary screen frame 24. The secondary screen frame 24 may be used to cover the region of the outer periphery of the secondary screen 2 except the fourth sub-side surface 232, or cover only the third sub-side surface 231.

In the first form, with reference to FIG. 21 and FIG. 22, the reversible frame segment 151 may be in a flipped state to avoid interference with the movement of the secondary screen 2. The secondary screen 2 may extend from the position of the reversible frame segment 151. Also, the reversible frame segment 151 in the flipped state may support the second back surface 22 of the secondary screen 2 to keep the state of the secondary screen 2. In this case, the shielding part 152a may be in a shielding state.

In the second form, the reversible frame segment 151 may be in a covering state to cover the first sub-side 131. The secondary screen 2 may be moved into the fixed frame segment 152, as shown in FIG. 23. The shielding part 152a may be in an open state to expose the secondary screen 2 moved into the fixed frame segment 152.

When in the covering state, the reversible frame segment 151 may be fixedly connected to the fixed frame segment 152 to improve the stability of the reversible frame segment 151 in the covering state. The fixing method for the reversible frame segment 151 may be snap connection, such that a user may operate the opening and closing at ease.

Figure 24:
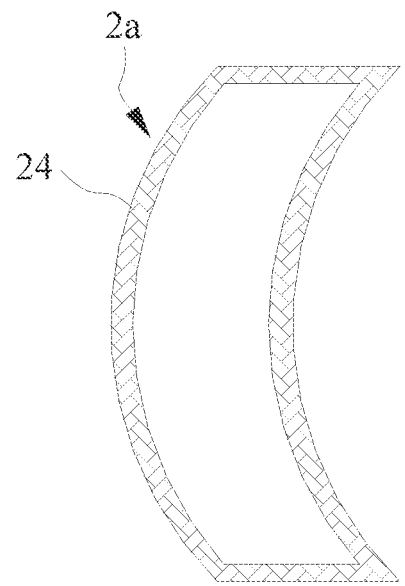
FIG. 24 illustrates a schematic structural diagram of a secondary screen configured with an all-inclusive sub-screen frame, consistent with the disclosed embodiments of the present disclosure.
Figure 25:
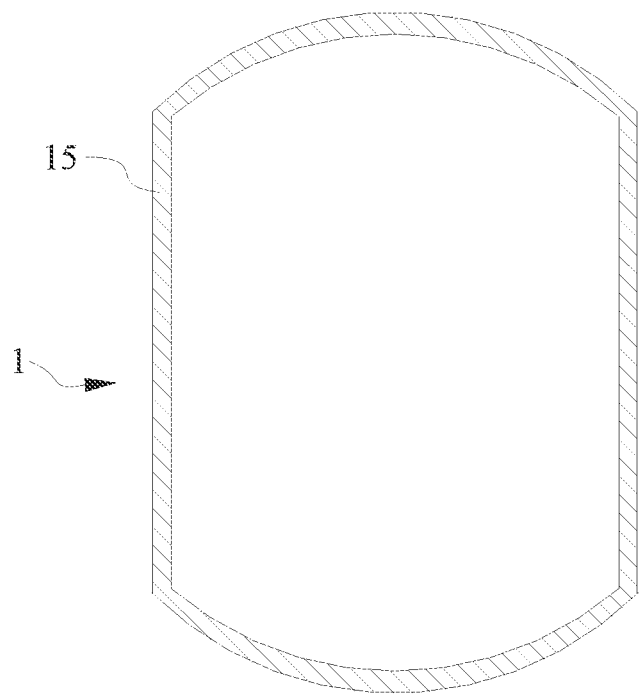
FIG. 25 illustrates a schematic structural diagram of a main screen configured with an all-inclusive main screen frame, consistent with the disclosed embodiments of the present disclosure.

In addition to the two configurations described above, the main screen 1 and the secondary screen 2 may also be provided with all-inclusive outer frames. FIG. 24 illustrates a schematic structural diagram of a secondary screen configured with an all-inclusive sub-screen frame. FIG. 25 illustrates a schematic structural diagram of a main screen configured with an all-inclusive main screen frame.

As shown in FIG. 24, the sub-screens 2a may be provided with an all-inclusive sub-screen frame 24 that may entirely wrap the sub-screens 2a. As shown in FIG. 25, the main screen 1 may be provided with an all-inclusive main screen frame 24 that may entirely wrap the main screen 1.

In the present disclosure, the main screen 1 and the secondary screen 2 may be made of a same material or different materials. Specific choices of materials may be related to the functions of the main screen 1 and the secondary screen 2.

In one embodiment, the main screen 1 may be mainly used for display, and the secondary screen 2 may be configured with functional devices such as sensors and cameras. In this case, the transmittance of the main screen 1 may be set to be lower than the transmittance of the secondary screen 2. Specifically, the pixels of the main screen 1 may be set to be higher than the pixels of the secondary screen 2.

The present disclosure also provides a terminal apparatus. The terminal apparatus includes a display device provided by the present disclosure. Since the display device has the technical effects described above, the terminal equipment may also have similar technical effects.

Figure 26:
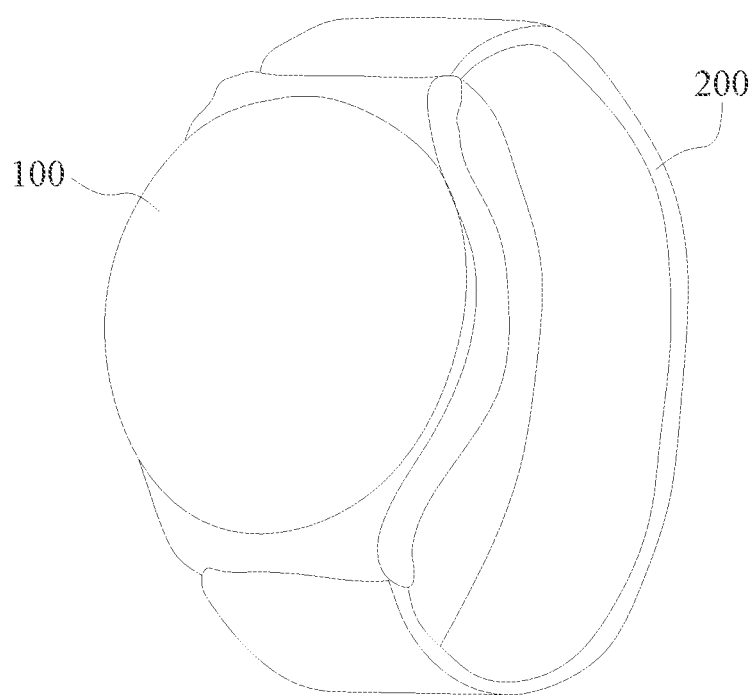
FIG. 26 illustrates a schematic structural diagram of an exemplary implementation of a terminal apparatus consistent with the disclosed embodiments of the present disclosure.

The present disclosure does not limit the type of the terminal apparatus. The terminal apparatus may be any product configured with a display function, such as a mobile phone, a wristband, a watch, etc. Different terminal facilities may exhibit different specific structures. FIG. 26 illustrates a schematic structural diagram of an exemplary implementation of a terminal apparatus consistent with the disclosed embodiments of the present disclosure. A terminal apparatus in the form of a watch as shown in FIG. 26 may include a display device 100 and a watch strap 200.

As disclosed, the technical solutions of the present disclosure have the following advantages.

The display device provided by the present disclosure includes a display screen and a first drive assembly. The display screen includes a main screen and a secondary screen. The first drive assembly is connected to at least one of the main screen and the secondary screen, and may be used to drive the main screen and/or the sub-screen to move, such that the size and/or shape of the display area of the display screen may be changed.

Since the size and/or shape of the display area of the display screen may be changed by moving the main screen and/or the secondary screen, the display device may exhibit a plurality of forms. A user may switch between the forms of the display device according to needs. Accordingly, user's requirements may be better met, and usage experiences may be improved.

Moreover, movements of the main screen and/or the secondary screen may be automatically completed under actions of the first drive assembly. A user may not need to directly apply force with fingers to movable parts in the main screen and/or the secondary screen to move the main screen and/or the secondary screen. On one hand, the automation level may be improved to reduce the operation difficulty of a user, and the usage experiences may thus be improved. On other hand, the shifting operations of the main screen and/or the secondary screen by a user with fingers may be reduced, and thus the main screen and the secondary screen may be protected. Accordingly, damage to the display screen may be reduced, and the service life of the display device may be extended.

The embodiments disclosed herein are exemplary only and not limiting the scope of the present disclosure. Various combinations, alternations, modifications, equivalents, or improvements to the technical solutions of the disclosed embodiments may be obvious to those skilled in the art. Without departing from the spirit and scope of this disclosure, such combinations, alternations, modifications, equivalents, or improvements to the disclosed embodiments are encompassed within the scope of the present disclosure.

What is claimed is:

1. A display device, comprising:
a display screen; and
a first drive assembly,
wherein:
the display screen comprises a main screen and a secondary screen;
the first drive assembly is connected to at least one of the main screen and the secondary screen, and is configured to drive the main screen and/or the secondary screen to move, for changing a size and/or a shape of a display area of the display screen; and
transmittance of the main screen is lower than transmittance of the secondary screen.

2. The display device according to claim 1, wherein:
a normal direction of the main screen is parallel to a normal direction of the secondary screen; and
the first drive assembly is configured to drive the secondary screen to move.

3. The display device according to claim 2, wherein:
the secondary screen comprises a plurality of sub-screens; and
the first drive assembly is configured to simultaneously drive each of the plurality of sub-screens to move.

4. The display device according to claim 2, wherein:
the main screen comprises a first display surface and a first back surface disposed opposite to the first display surface, and the secondary screen includes a second display surface and a second back surface disposed opposite to the second display surface;
the display device comprises a first form and a second form;
in the first form, the secondary screen is located on a side of the first back surface, wherein the second display surface faces the first back surface, and in a direction perpendicular to a plane where the main screen is located, the secondary screen and the main screen at least partially overlap; and
in the second form, the first display surface and the second display surface face toward a same direction, and the secondary screen and the main screen do not overlap.

5. The display device according to claim 4, wherein:
the main screen further comprises a first side surface connecting the first display surface and the first back surface, and the secondary screen further comprises a second side surface connecting the second display surface and the second back surface;

the first side surface comprises a first sub-side surface and a second sub-side surface disposed adjacently, wherein, in the first form, along a direction perpendicular to the plane where the main screen is located, the first sub-side surface is located in the secondary screen;

the second side surface comprises a third sub-side surface and a fourth sub-side surface disposed opposite to the third sub-side surface, wherein the fourth sub-side surface and the second sub-side surface have a same extension shape and a same extension length in a circumferential direction;

in the first form, along the direction perpendicular to the plane where the main screen is located, the third sub-side surface and the main screen at most partially overlap, and the fourth sub-side surface is at least partially located within the main screen; and in the second form, along the direction perpendicular to the plane where the main screen is located, the fourth sub-side surface abuts the second sub-side surface.

6. The display device according to claim 5, wherein:
in the first form, the third sub-side surface and the main screen do not overlap;
the fourth sub-side surface is located within the main screen; and
along the direction perpendicular to the plane where the main screen is located, the second sub-side surface abuts the third sub-side surface[ ].

7. The display device according to claim 6, wherein:
the secondary screen comprises two sub-screens oppositely disposed;
the second side surface of the sub-screens comprises a third sub-side surface and a fourth sub-side surface;
the second side surface of the sub-screens further comprises two fifth sub-side surfaces connecting the third sub-side surface and the fourth sub-side surface;
along the direction perpendicular to the plane where the main screen is located, each of the first sub-side surface and the fifth sub-side surfaces has a straight line shape;
the first side surface comprises two first sub-side surfaces oppositely disposed; and
in the second form, the two first sub-side surfaces and the two fifth sub-side surfaces are connected in a one-to-one correspondence, and are coplanar.

8. The display device according to claim 7, wherein:
the first drive assembly comprises a motor and a transmission mechanism, wherein the motor is connected to the two sub-screens through the transmission mechanism.

9. The display device according to claim 8, wherein:
the transmission mechanism includes two L-shaped transmission rods, wherein:
a plane where the transmission rods are located is parallel to a plane where the sub-screens are located; and
one end of the transmission rod interacts with the sub-screens, and an other end of the transmission rod is connected to the motor.

10. The display device according to claim 9, wherein:
the transmission mechanism further comprises a support body, wherein the two transmission rods are rotatably connected to the support body.

11. The display device according to claim 1, wherein:
the main screen comprises a first display surface and a first back surface disposed opposite to the first display surface, and the secondary screen comprises a first screen part and a second screen part that are split from each other, wherein each of the first screen part and the second screen part comprises a second display surface and a second back surface disposed opposite to the second displace surface; and the first drive assembly includes a first telescopic mechanism and a second telescopic mechanism, wherein the first telescopic mechanism is connected to the first screen part, and the second telescopic mechanism is connected to the second screen part.

12. The display device according to claim 11, wherein:
the display device comprises a first form and a second form;
in the first form, the second display surface of the first screen part is in a same direction as the first display surface, the first screen part and the main screen are coplanar, and the second display surface of the second screen part is in a same direction as the first display surface, wherein, in a direction perpendicular to the plane where the main screen is located, the second screen part is located within the main screen; and
in the second form, the second screen part is located between the first screen part and the main screen; wherein, each of the second display surfaces of the first screen part and the second screen part is in a same direction as the first display surface, and the first screen part, the second screen part, and the main screen are coplanar.

13. The display device according to claim 12, further comprising a mounting frame,
wherein:
each of the first telescopic mechanism and the second telescopic mechanism is disposed on the mounting frame.

14. The display device according to claim 5, wherein:
a movable frame is disposed in a part of an outer periphery area of the main screen;
the display device further comprises a second drive assembly, wherein the second drive assembly is connected to the movable frame for driving the movable frame to move along the outer periphery of the main screen;
the secondary screen is disposed with a secondary-screen frame, wherein the secondary-screen frame is configured to cover an area of an outer periphery of the secondary screen except the fourth sub-side surface; and
in the first form, the movable frame is configured to cover the second sub-side surface, and in the second form, the movable frame is configured to cover the first sub-side surface.

15. The display device according to claim 14, wherein:
the movable frame has an adjustable length.

16. The display device according to claim 5, wherein:
an outer periphery of the main screen is disposed with a main screen frame;
a part of the main screen frame for covering the first sub-side surface is a reversible frame segment, wherein the reversible frame segment comprises a covering state when the reversible frame segment covers the first sub-side surface and a flipped state when the reversible frame segment is separated from the first sub-side surface;
a part of the main screen frame for covering the second sub-side surface is a fixed frame segment, and the fixed frame segment comprises a shielding part, wherein the shielding part comprises a shielding state and an open state, in the shielding state, the shielding part shields internal components of the fixed frame segment, and in the open state, the internal components of the fixed frame segment are exposed; and the secondary screen is disposed with a secondary screen frame, wherein the secondary screen frame at least covers the third sub-side surface.

17. The display device according to claim 16, wherein:
in the first form, the reversible frame segment is in a flipped state, the secondary screen extends from a location of the reversible frame segment, and the shielding part is in a shielding state; and
in the second form, the reversible frame segment is in a covering state, the secondary screen is moved into the fixed frame segment, and the shielding part is in an open state.

18. A display device according to claim 1, comprising wherein:
a display screen; and
a first drive assembly,
wherein:
the display screen comprises a main screen and a secondary screen;
the first drive assembly is connected to at least one of the main screen and the secondary screen, and is configured to drive the main screen and/or the secondary screen to move, for changing a size and/or a shape of a display area of the display screen; and
the main screen is disposed with an all-inclusive main-screen frame, and the secondary screen is disposed with an all-inclusive secondary-screen frame.

19. A terminal apparatus, comprising a display device, wherein the display device comprises:
a display screen; and
a first drive assembly,
wherein:
the display screen comprises a main screen and a secondary screen;
the first drive assembly is connected to at least one of the main screen and the secondary screen, and is configured to drive the main screen and/or the secondary screen to move, for changing a size and/or a shape of a display area of the display screen; and
transmittance of the main screen is lower than transmittance of the secondary screen.

* * * * *